United States Patent [19]
Borchert et al.

[11] Patent Number: 5,953,361
[45] Date of Patent: Sep. 14, 1999

[54] DFB LASER DIODE STRUCTURE HAVING COMPLEX OPTICAL GRATING COUPLING

[75] Inventors: Bernd Borchert, Moosburg/Isar; Bernhard Stegmüller, Augsburg, both of Germany

[73] Assignee: Siemens Aktiengesellschaft, Munich, Germany

[21] Appl. No.: 08/973,063

[22] PCT Filed: May 13, 1996

[86] PCT No.: PCT/DE96/00837

§ 371 Date: Nov. 25, 1997

§ 102(e) Date: Nov. 25, 1997

[87] PCT Pub. No.: WO96/38890

PCT Pub. Date: Dec. 5, 1996

[30] Foreign Application Priority Data

May 31, 1995 [DE] Germany ............................ 195 20 043

[51] Int. Cl.[6] .................................................. H01S 3/08
[52] U.S. Cl. .......................... 372/96; 372/102; 372/45; 372/46; 437/129
[58] Field of Search .............................. 372/96, 102, 45, 372/46; 437/129

[56] References Cited

U.S. PATENT DOCUMENTS

| 4,843,032 | 6/1989 | Tokuda et al. | 437/129 |
| 5,208,824 | 5/1993 | Tsang | 372/96 |
| 5,276,702 | 1/1994 | Meliga | 372/96 |
| 5,452,318 | 9/1995 | Makino et al. | 372/96 |

FOREIGN PATENT DOCUMENTS

| 0 507 956 A1 | 10/1992 | European Pat. Off. . |
| 0 727 852 A1 | 8/1996 | European Pat. Off. . |
| 41 24 872 A1 | 1/1993 | Germany . |

OTHER PUBLICATIONS

IEEE Photonics Technology Letter, vol. 4, No. 7, Jul. 1992, Y. Luo et al., "Gain–Coupled . . . Grating," pp. 692–695.

IEEE Journal of Quantum Electronics, vol. 30, No. 6, Jun. 1994, W. Tsang et al, "Long–Wavelength . . . Epitaxy," pp. 1370–1380.

Electronics Letter, vol. 30, No. 1, Jan. 6, 1994, J. Zoz, "Dynamic . . . Grating," pp. 39–40.

Electronics Letters, vol. 28., No. 18, Aug. 27, 1992, G. P. Li et al, "1.55μm . . . Grating," pp. 1726–1727.

American Institute of Physics, May 25, 1992, W. T. Tsang et al, "Semiconductor . . . Feedback," pp. 2580–2582.

*Primary Examiner*—Rodney Bovernick
*Assistant Examiner*—Sung T. Kim
*Attorney, Agent, or Firm*—Hill & Simpson

[57] ABSTRACT

In the DFB laser diode structure, having complex optical grating coupling, the grating has a layer (52) made from volumetric index semiconductor material, and a layer (53) made from volumetric absorption semiconductor material, the two layers (52, 53) being situated one above another and not being phase-shifted with respect to one another.

13 Claims, 2 Drawing Sheets

DFB LASER DIODE STRUCTURE HAVING COMPLEX OPTICAL GRATING COUPLING

BACKGROUND OF THE INVENTION

The invention relates to a DFB laser diode structure having complex optical grating coupling.

A DFB laser diode structure of this type is known from IEEE Photonics Technology Letters, Vol. 4, July 1992, pages 692–695 or from EP-A-0 507 956.

German reference DE 41 24 872 A1 or B. Borchert et al., Electronics Letters, Vol. 29 (1993), pages 210–211 discloses a DFB laser diode structure that comprises all features of a laser diode structure of the species initially cited, except for the features that the layer of the index material and the layer of the absorption semiconductor material are respectively composed of volumetric material and both the layer of the volumetric index material as well as the layer of the volumetric absorption semiconductor material are located between the one cladding layer and the relief surface in the projections of the grating.

Given this known structure, the layer of the index semiconductor material is present in the defined forward projections of the optical grating, but the layer of the absorption semiconductor material is located only in the defined backward projections of this grating.

These forward projections and backward projections are constructed with, for example, a triangular profile. In this case, the layer made from the absorption semiconductor material which is required for the complex grating coupling should be constructed only at the vertices of the triangular backward projections of the holographically produced grating. Consequently, the effect of the complex coupling depends decisively on how reproducibly the grating shape of the grating, which forms a Bragg grating, can be produced. Fluctuations in the grating shape, which can occur owing to unavoidable fluctuations in the technical process parameters during the production of the grating, therefore have a particularly strong effect in the case of this form of realization of the complex coupling on the intensity of the complex coupling and thus on the spectral characteristics of the DFB laser diode structure.

SUMMARY OF THE INVENTION

In general the present invention is a DFB laser diode structure having complex optical grating coupling. A laser-active layer is arranged between two optical cladding layers made from semiconductor material of mutually opposite conductivity types. A layer of an index semiconductor material in the form of volumetric material is arranged at a side of one of the two cladding layers facing away from the laser-active layer. A layer of an absorption semiconductor material in the form of volumetric material is arranged at a side of the layer of index semiconductor material facing away from the one cladding layer. An optical grating constructed in the layer is made from the index semiconductor material and the layer made from the absorption semiconductor material, in the form of a relief surface which is averted from the laser-active layer and defines forward projections of the grating pointing in the direction away from the laser-active layer and backward projections of the grating pointing towards the laser-active layer. The layer made from the index semiconductor material and the layer made from the absorption semiconductor material are of mutually opposite conductivity types. Both the layer made from the index semiconductor material and the layer made from the absorption semiconductor material are located between the one cladding layer and the relief surface in the forward projections of the grating. Located on the side, averted from the laser-active layer, of the relief surface is a body which abuts the relief surface and is made from a semiconductor material of the conductivity type of the one cladding layer. A further layer of semiconductor material in the form of volumetric material different from the index semiconductor material and absorption semiconductor material is located in the forward projections of the grating between the layers of the absorption and index semiconductor material and the relief surface. The body adjoining the relief surface is composed of the same semiconductor material as the further layer.

Advantageous developments of the present invention are as follows.

The layer made from the index semiconductor material is of the same conductivity type as the one cladding layer.

The layer made from the absorption semiconductor material is located between the layer made from the index semiconductor material and the further layer.

The further layer is composed of intrinsic semiconductor material.

The layer made from the index semiconductor material and the layer made from the absorption semiconductor material abut one another.

The layer made from the index semiconductor material and the layer made from the absorption semiconductor material are separated from one another by a spacer layer made from an intrinsic semiconductor material.

The body adjoining the relief surface is composed of a layer of volumetric material.

The body adjoining the relief surface comprises a substrate having a substrate surface in the form of a relief complementary to the relief surface that lies opposite the relief surface.

The grating in the region of the layer made from the index semiconductor material has a pulse duty factor (b/a) of essentially 50%.

The semiconductor material of the two cladding layers is composed of InP, the index semiconductor material is composed of InGaAsP, the absorption semiconductor material is composed of InGaAs and the semiconductor material of the further layer (54) of InP.

The spacer layer comprises InP.

The DFB laser diode structure according to the invention, having complex grating coupling, advantageously produces an improved reproducibility of the grating structure during production. Moreover, compared to the diode structure described in German reference DE 41 24 872 A1 or in B. Borchert et al., the laser diode structure according to the invention advantageously achieves an improved monomode yield and monomode emission over a large temperature range. Spectral monomode DFB laser diode structures are key components in optical telecommunications engineering.

The laser diode structure according to the invention has, moreover, the advantage that there is a relatively wide design freedom in the production of the complex coupling intensity through the use of the volumetric materials, and a better long term stability can be achieved with few boundary surfaces at which layers abut.

Volumetric material means that the layer comprising such a material is so thick that no quantum effects occur, as is the case in thin quantum-well layers.

The laser diode structure according to the invention has, moreover, the advantage of the possibility of realizing a technology-tolerant buried grating, and of the possibility of simultaneously realizing a grating made from index material and a grating made from absorption material.

Index semiconductor material and absorption semiconductor material mean that the index semiconcuctor material is more transparent to the relevant light than is the absorption semiconductor material, and the absorption semiconductor material absorbs this light more strongly than the index semiconductor material. In the case of the index semiconductor material, the real part of the complex refractive index prevails over the imaginary part, while in the case of the absorption semiconductor material the imaginary part prevails over the real part.

It may be pointed out that it is known from G.P. Li et al., Electronics Letters, Vol. 28 (1992), pages 1726–1727 to realize a gain grating by etching the Bragg grating into the active layer, comprising a multi-quantum-well structure (MQW structure), of the laser diode structure. There is a risk of a lack of long term stability owing to the fact that the active layer is structured over the whole surface in this laser diode structure.

It is known from W. T. Tsang et al., Applied Physics Letters, Vol. 60 (1992), pages 2580–2582 to produce the complex coupling by etching the Bragg grating into a second MQW structure which in addition to the active MQW layer of this laser diode structure is situated either below or above this last-named layer and thus outside the pn junction of this diode structure. Either a grating made from index semiconductor material or a grating made from absorption semiconductor material can be realized by appropriate design of this MQW structure. This grating structure can also be buried, as a result of which the strong dependence of the complex coupling intensity on the technology process parameters, which is present in the known laser diode structure according to the preamble of Patent claim 1 described in more detail above can be reduced. However, the laser diode structure according to Tsang et al. has many boundary surfaces of the second MQW structure structured over the whole surface, which lead to long term stability problems, as well as a restricted parameter space, adjustable by design, in the complex grating coupling, which is caused by the thin MQW layers.

The laser diode structure according to the invention combines the advantage, which is likewise respectively present in the structure according to German reference DE 5 41 24 872 A1 and the structure according to Borchert et al., of the relatively wide design freedom in adjusting the complex coupling intensity by using thick volumetric materials and the potentially better long term stability owing to few boundary surfaces with the advantage present in the case of the structure according to Chang et al., of the possibility of realizing a technology-tolerant buried grating and the simultaneous realization of a grating made from index semiconductor material and a grating made from absorption semiconductor material. At the same time, it is advantageous that the effect of the complex coupling does not, as in the case of the structure according to German reference DE 41 24 872 A1 or Borchert et al., depend on how reproducibly the grating shape of the Bragg grating can be produced, and it is advantageous that many boundary surfaces of the second MQW structure which cause potential long term stability problems are not, as in the case of the structure according to Chang et al., present, and the restricted parameter space, which is caused by the thin MQW layers and can be adjusted by design, is not present in the complex grating coupling.

The method according to the invention is suitable for producing complex coupled DFB laser diodes having monomode emission at 1.3 μm and 1.55 μm.

The invention is explained in more detail by way of example in the following description with the aid of the figures.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
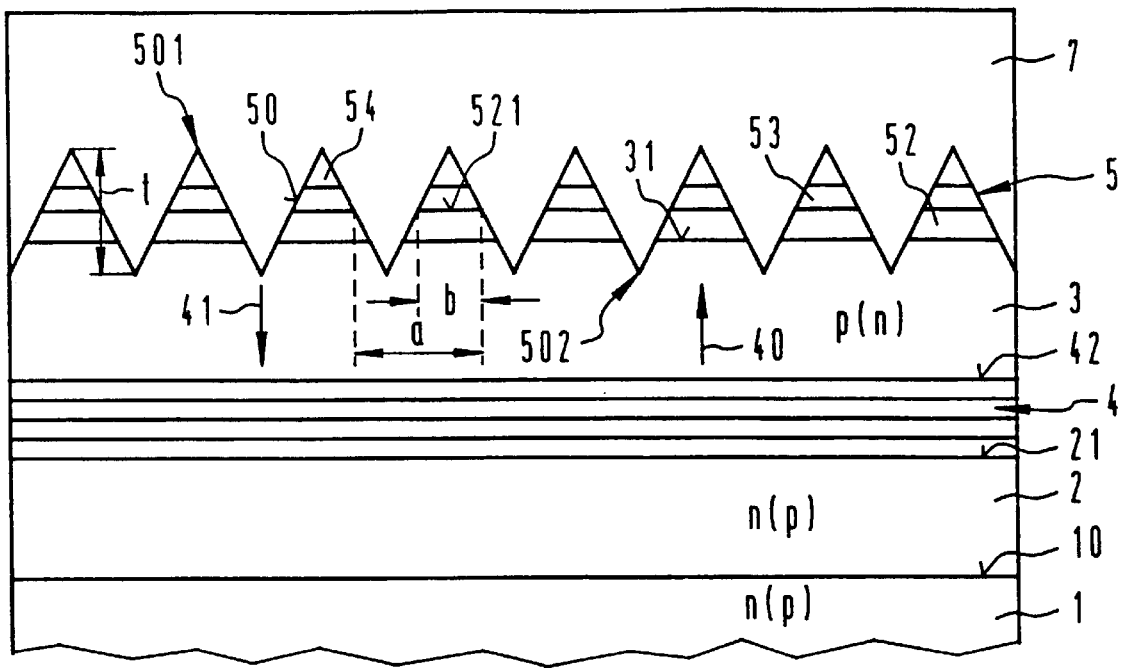
FIGS. 1 to 4 show the same cross-sectional representation in each case of four variant embodiments of the laser diode structure according to the invention.
Figure 2:
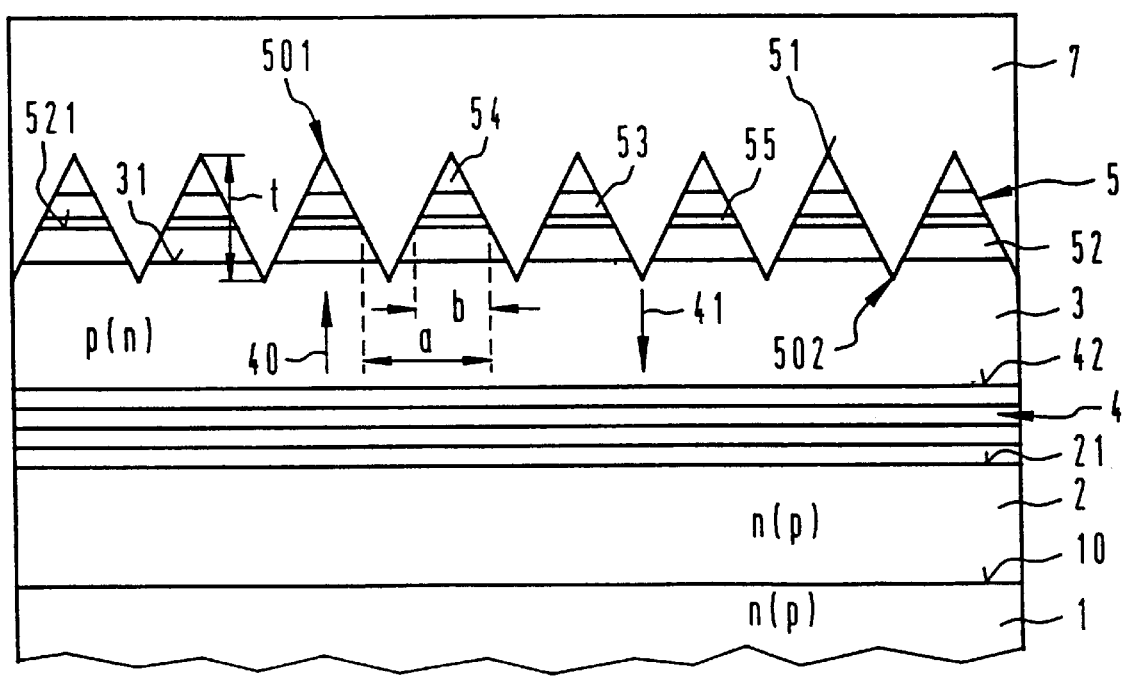

In the two variants according to FIGS. 1 and 2, there is applied to the surface 10 of a substrate 1 made from semiconductor material of one conductivity type, for example of the type corresponding to an n-doping, a cladding layer 2 made from semiconductor material of the same conductivity type n. A laser-active layer 4 is applied to the cladding layer 2 on the side 21, averted from the substrate 1, of the cladding layer 2. The laser-active layer 4 can comprise volumetric material or can have a quantum-well layer, for example be a MQW layer, as is indicated in the drawing.

On the side 41, averted from the cladding layer 2, of the laser-active layer 4, a cladding layer 3 made from semiconductor material of the conductivity type opposite to the material of the cladding layer 2, in the given example of the type corresponding to a p-doping, is applied to the laser-active layer 4. In principle, the cladding layer 3 could also be of the conductivity type n, and the cladding layer 2 and the substrate 1 of the conductivity type p.

Temporarily ignoring the grating 5 which is to be described later, on the side 31 of the cladding layer 3 averted from the laser-active layer 4, a layer 52 made from index semiconductor material is applied to the cladding layer 3. On the side 521, averted from the cladding layer 3, of the layer 52 made from the index semiconductor material, a layer 53 made from an absorption semiconductor material is applied to the layer 52 made from the index semiconductor material.

The optical grating 5 is constructed in the form of a relief surface 50 which is averted from the laser-active layer 4 in the layer 52 made from the index semiconductor material and the layer 53 made from the absorption semiconductor material. The relief surface 50 defines forward projections 501 of the grating 5, which depart in the direction 40 from the one cladding layer 3, and defines backward projections 502 of the grating 5 pointing in the opposite direction 41 towards the one cladding layer 3.

According to the invention, both the layer 52 made from the index semiconductor material and the layer 53 made from the absorption semiconductor material comprise volumetric material and, furthermore, both the layer 52 made from the volumetric index semiconductor material and the layer 53 made from the volumetric absorption semiconductor material are located between the one cladding layer 3 and the relief surface 50 in the forward projections 501 of the grating 5.

For example, the forward projections 501 and backward projections 502 of the grating 5 are of elongated construction and arranged such that their longitudinal axis is at right angles to the plane of the drawing. Moreover, the forward projections 501 and backward projections 502 respectively have a triangular profile, as represented in the figures.

The depth t of the forward projections 501 must be at least so large that at least the layer 53 made from the volumetric absorption material is interrupted. However, it is preferred for the backward projections 502 to be so deep that both the layer 53 made from the volumetric absorption semiconductor material and the layer 52 made from the volumetric index semiconductor material are interrupted. In the case of this example, the two layers 53 and 52 form parallel strips which are arranged at a constant spacing next to one another and have a longitudinal axis which is at right angles to the plane of the drawing and a mean width b, which can themselves be regarded as an optical grating having a grating constant a.

The structure according to FIG. 1 and the structure according to FIG. 2 differ from one another essentially in that in the structure according to FIG. 1 the layer 52 made from the volumetric index semiconductor material and the layer 53 made from the volumetric absorption semiconductor material directly abut one another, and in the case of the structure according to FIG. 2 the layer 52 made from the volumetric index semiconductor material and the layer 53 made from the volumetric absorption semiconductor material are separated from one another by a thin spacer layer 55 made from a preferably intrinsic semiconductor material.

In order to realize a buried grating 5 in which there is an improved reproducibility in the production of the grating there is located between the layers 52 and 53 made from the volumetric index and volumetric absorption semiconductor material and the relief surface 50 a further layer 54, which is made from preferably intrinsic volumetric semiconductor material and, like the layers 52 and 53, is constructed in the forward projections 501 of the grating 5. This further layer 54 serves for the epitaxial growth of a layer 7, abutting the relief surface, made from a semiconductor material of the same conductivity type p as the cladding layer 3, the volumetric material of the layer 7 preferably being the volumetric material of the further layer 54.

The buried grating 5 produced by the layer 7 has the advantage that a grating 5 can be set which has a pulse duty factor b/a of 50%, which ensures a maximum insensitivity to technologically induced fluctuations in the grating shape.

The layer 53 made from the volumetric semiconductor absorption material is preferably arranged between the layer 52 made from the volumetric index semiconductor material and the further layer 54 or the relief surface 50.

In order to prevent instability in the complex coupled DFB laser diode structure, the layer 52 made from the index semiconductor material and the layer 53 made from the absorption semiconductor material are of mutually opposite conductivity types. It is expedient in this case if the layer 52 made from the index semiconductor material is of the same conductivity type as the one cladding layer 3, being of type p in the case of the example.

The laser diode structure according to the invention in accordance with FIGS. 1 and 2 can advantageously be produced in only two epitaxy steps, the first epitaxy producing all the layers up to and including the further layer 54. The second epitaxy is essentially the overgrowing of the grating 5 with the layer 7.

Figure 3:
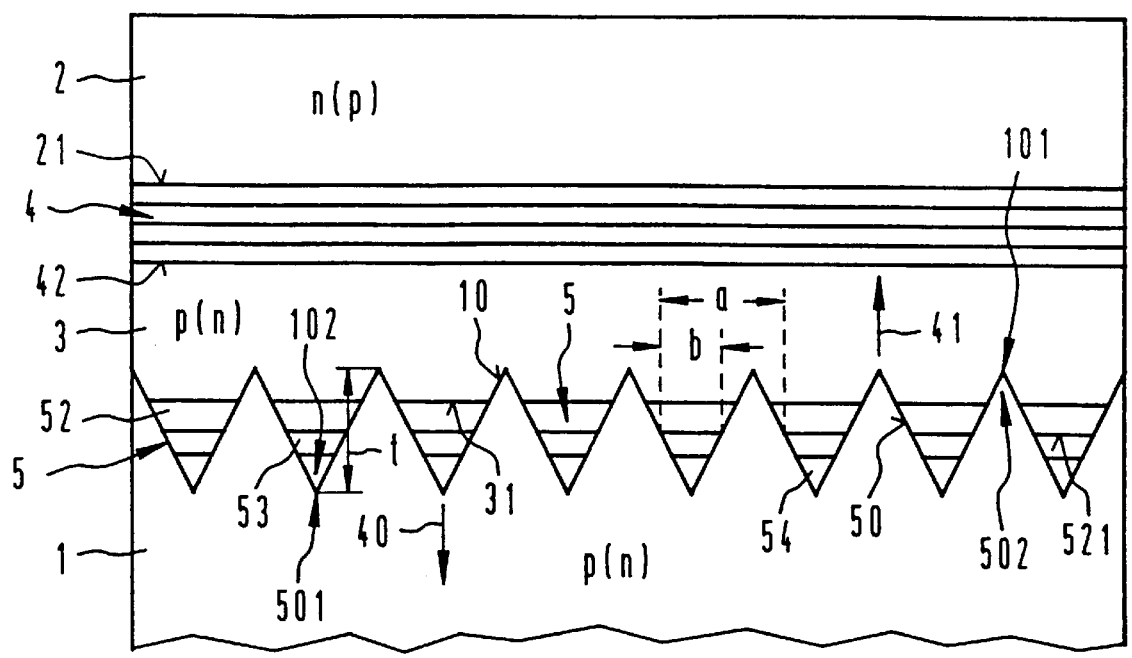
Figure 4:
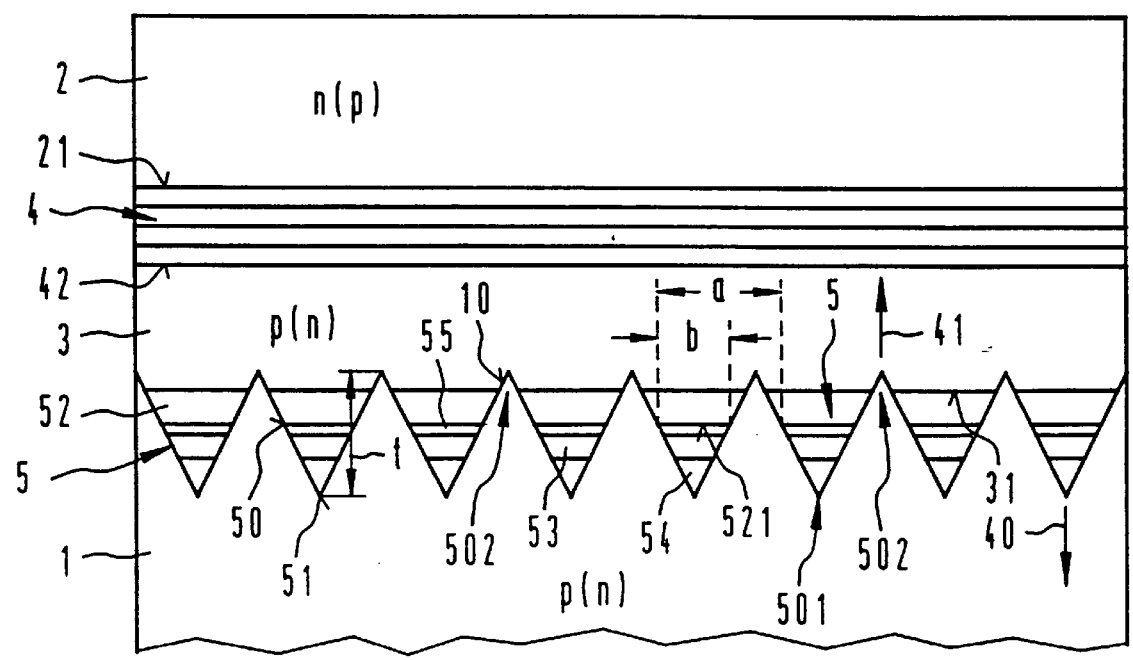

The two laser diode structures according to the invention in accordance with FIGS. 3 and 4 differ from the laser diode structures according to the invention in accordance with FIGS. 1 and 2 in that there is located on the relief surface 50, which is averted from the laser-active layer 4 and forms the grating 5, a body which abuts this relief surface and is not in the form of the layer 7 according to FIGS. 1 and 2 but in the form of the substrate 1 made from the semiconductor material of the conductivity type of the layer 52 made from the index semiconductor material, this substrate 1 having a substrate surface 10 which is opposite the relief surface 50 and complementary to this relief surface 50.

Complementary means in this connection that the substrate surface 10 has forward projections 101, which point in the direction 41 of the laser-active layer 4, precisely where the relief surface 50 has depressions pointing in the direction 41 of the laser-active layer 4, and has backward projections 102 which point in the direction 40 away from the laser-active layer 4 precisely where the relief surface 50 has forward projections 501 pointing in the direction 40 away from the laser-active layer 4. Consequently, a forward projection 501 of the relief surface 50 projects into each backward projection 102 of the substrate 1, and a forward projection of the substrate surface 10 projects into each backward projection 502 of the relief surface 50.

All the remaining parts of the structures according to FIGS. 3 and 4, which are identical to parts of the structures according to FIGS. 1 and 2, are provided with the same reference symbols. The description of such parts has already been given in connection with FIGS. 1 and 2 and will not be repeated.

The structure according to FIG. 3 differs from the structure according to FIG. 4 in exactly the same way as the structure according to FIG. 1 differs from the structure according to FIG. 2, that is to say in the structure according to FIG. 3 the layer 52 made from the index semiconductor material and the layer 53 made from the absorption semiconductor material directly abut one another, while in the structure according to FIG. 4 these layers 52 and 53 are separated from one another by a thin spacer layer 55.

Furthermore, a slight difference between the structures according to FIGS. 3 and 4 and the structures according to FIGS. 1 and 2 resides in the fact that, assuming the cladding layer 2 is of conductivity type n in all variant structures, the substrate 1 must likewise be of type n in the structures according to FIGS. 1 and 2, while the substrate 1 must be of conductivity type p in the structures according to FIGS. 3 and 4. The relationships are reversed if the cladding layer 2 is of conductivity type p in all the variant structures.

A further difference resides further in the fact that in the structures according to FIGS. 3 and 4 the layer 54 is not so necessary as in the structures according to FIGS. 1 and 2, because the layers 53 and 52 can be grown directly onto the substrate surface 10.

The structures according to FIGS. 3 and 4 have the advantage that only one epitaxy is required when producing this structure. Firstly, the substrate surface 10 is structured such that it has the forward projections 101 and the backward projections 102, and then all the layers are grown on using a single epitaxy. In the case of the use of the layer 54, the growth parameters in the epitaxy can be adjusted such that the layer 54 is present not only at the vertices of the backward projections 102, but rather covers the entire substrate surface 10.

In a preferred exemplary embodiment of the structures according to FIGS. 1 and 2, the substrate is composed of n-doped InP, the cladding layer of n-doped InP, the active layer 4 of a MQW structure, the cladding layer 3 of p-doped InP, the layer 52 of p-doped InGaAsP, the layer 53 of n-doped InGaAs, the further layer 54 of [sic] InP, and the layer 7 of p-doped InP. The spacer layer 55 comprises InP.

In an exemplary embodiment of the structures according to FIGS. 3 and 4, the substrate 1 is composed of p-doped InP, the layer 54 of InP, the layer 53 of n-doped InGaAs, the layer 52 of p-doped InGaAsP, the cladding layer 3 of p-doped InP, the active layer 4 of a MQW structure, and the cladding layer 2 of n-doped InP.

The spacer layer 55 is composed InP.

In these exemplary embodiments, at a wavelength of 1.55 μm the quaternary InGaAsP of the layer 53 could have a band-gap wavelength of 1.15 μm, while the ternary InGaAs of the layer 53 made from volumetric absorption semiconductor material could have a band-gap wavelength of 1.66 μm.

The invention is not limited to the particular details of the apparatus depicted and other modifications and application are contemplated. Certain other changes may be made in the above described apparatus without departing from the true spirit and scope of the invention herein involved. It is intended, thereof, that the subject matter in the above depiction shall be interpreted as illustrative and not in a limiting senses.

What is claimed is:

1. A DFB laser diode structure having complex optical grating coupling, comprising:

a laser-active layer arranged between first and second optical cladding layers made from semiconductor material of mutually opposite conductivity types;

a first layer of an index semiconductor material in a form of volumetric material that is arranged at a side of the second optical cladding layer that faces away from the laser-active layer;

a second layer of an absorption semiconductor material in a form of volumetric material that is arranged at a side of the first layer of index semiconductor material that faces away from the second optical cladding layer;

an optical grating constructed in the first layer made from the index semiconductor material and the second layer made from the absorption semiconductor material, the optical grating being a relief surface which is averted from the laser-active layer and defines forward projections of the grating pointing in the direction away from the laser-active layer and backward projections of the grating pointing towards the laser-active layer;

the first layer made from the index semiconductor material and the second layer made from the absorption semiconductor material being of mutually opposite conductivity types;

both the first layer made from the index semiconductor material and the second layer made from the absorption semiconductor material located between the second optical cladding layer and the relief surface in the forward projections of the grating;

a body located on a side, averted from the laser-active layer, of the relief surface, the body abutting the relief surface and made from a semiconductor material of the conductivity type of the second optical cladding layer;

a further layer of semiconductor material in a form of volumetric material different from the index semiconductor material and absorption semiconductor material, the further layer being located in the forward projections of the grating between the first and second layers of the absorption and index semiconductor material and the relief surface; and the body adjoining the relief surface being composed of the same semiconductor material as the further layer.

2. The laser diode structure according to claim 1, wherein the first layer made from the index semiconductor material is of the same conductivity type as the second optical cladding layer.

3. The laser diode structure according to claim 1, wherein the second layer made from the absorption semiconductor material is located between the first layer made from the index semiconductor material and the further layer.

4. The laser diode structure according to claim 1, wherein the further layer is composed of intrinsic semiconductor material.

5. The laser diode structure according to claim 1, wherein the first layer made from the index semiconductor material and the second layer made from the absorption semiconductor material abut one another.

6. The laser diode structure according to claim 1, wherein the first layer made from the index semiconductor material and the second layer made from the absorption semiconductor material are separated from one another by a spacer layer made from an intrinsic semiconductor material.

7. The laser diode structure according to claim 1, wherein the body adjoining the relief surface is composed of a layer of volumetric material.

8. The laser diode structure according to claim 1, wherein the body adjoining the relief surface has a substrate having a substrate surface in a form of a relief complementary to the relief surface that lies opposite the relief surface.

9. The laser diode structure according to claim 1, wherein the grating in a region of the first layer made from the index semiconductor material has a pulse duty factor of substantially 50%.

10. The laser diode structure according to claim 1, wherein the semiconductor material of the first and second optical cladding layers is composed of InP, the index semiconductor material is composed of InGaAsP, the absorption semiconductor material is composed of InGaAs and the semiconductor material of the further layer is composed of InP.

11. The laser diode structure according to claim 6, wherein the spacer layer is InP.

12. The laser diode structure according to claim 6, wherein the semiconductor material of the first and second optical cladding layers is composed of InP, the index semiconductor material is composed of InGaAsP, the absorption semiconductor material is composed of InGaAs and the semiconductor material of the further layer is composed of InP.

13. The laser diode structure according to claim 12, wherein the spacer layer is InP.

* * * * *